United States Patent
Nakamura

(10) Patent No.: US 9,636,796 B2
(45) Date of Patent: May 2, 2017

(54) LAMINATED POLISHING PAD AND METHOD FOR PRODUCING SAME

(71) Applicant: TOYO TIRE & RUBBER CO., LTD., Osaka-shi, Osaka (JP)

(72) Inventor: Kenji Nakamura, Osaka (JP)

(73) Assignee: ROHM AND HAAS ELECTRONIC MATERIALS CMP HOLDINGS, INC., Newark, DE (US)

( * ) Notice: Subject to any disclaimer, the term of this patent is extended or adjusted under 35 U.S.C. 154(b) by 414 days.

(21) Appl. No.: 14/390,959

(22) PCT Filed: Feb. 28, 2013

(86) PCT No.: PCT/JP2013/055516
§ 371 (c)(1),
(2) Date: Oct. 6, 2014

(87) PCT Pub. No.: WO2013/153875
PCT Pub. Date: Oct. 17, 2013

(65) Prior Publication Data
US 2015/0079879 A1 Mar. 19, 2015

(30) Foreign Application Priority Data
Apr. 11, 2012 (JP) ................................. 2012-090241

(51) Int. Cl.
*B24B 37/005* (2012.01)
*B24B 37/22* (2012.01)
(Continued)

(52) U.S. Cl.
CPC .......... *B24B 37/205* (2013.01); *B24B 37/013* (2013.01); *B24B 37/22* (2013.01);
(Continued)

(58) Field of Classification Search
CPC .......... B24B 37/005; B24B 37/22; B32B 3/10
See application file for complete search history.

(56) References Cited

U.S. PATENT DOCUMENTS

| 8,393,933 B2* | 3/2013 | Qian ................. B24B 37/013 451/6 |
| 2005/0070216 A1 | 3/2005 | Roberts et al. |

(Continued)

FOREIGN PATENT DOCUMENTS

| JP | 2002-224944 A | 8/2002 |
| JP | 2005-167200 A | 6/2005 |

(Continued)

OTHER PUBLICATIONS

Notification of Transmittal of Translation of the International Preliminary Report on Patentability (PCT/IB/338) mailed Oct. 23, 2014, with International Preliminary Report on Patentability (PCT/IB/373) and Written Opinion of the International Searching Authority (PCT/ISA/237), for corresponding international application PCT/JP2013/055516.

(Continued)

Primary Examiner — Pegah Parvini
(74) Attorney, Agent, or Firm — Law Office of Katsuhiro Arai

(57) ABSTRACT

A method for manufacturing a laminated polishing pad of the present invention, comprising the steps of: forming a polishing layer by providing a light transmitting region in an opening A of a polishing region; providing an adhesive member X on one side of the polishing layer, wherein the adhesive member X contains a hot-melt adhesive; providing a removable protective member on a part of the adhesive member X corresponding to the light transmitting region; bonding a support layer to the adhesive member X on which the removable protective member is provided; and removing a part of the support layer corresponding to the light trans- (Continued)

mitting region and also removing the removable protective member to form an opening B.

17 Claims, 4 Drawing Sheets

(51) Int. Cl.
  *B32B 3/10* (2006.01)
  *H01L 21/306* (2006.01)
  *B24B 37/20* (2012.01)
  *B24B 37/013* (2012.01)
  *B32B 37/18* (2006.01)
  *B32B 38/10* (2006.01)
  *B32B 37/12* (2006.01)
  *B32B 38/00* (2006.01)

(52) U.S. Cl.
  CPC .......... *B32B 37/1207* (2013.01); *B32B 37/18* (2013.01); *B32B 38/10* (2013.01); *H01L 21/30625* (2013.01); *B32B 2037/1223* (2013.01); *B32B 2038/0016* (2013.01)

(56) References Cited

U.S. PATENT DOCUMENTS

| | | | |
|---|---|---|---|
| 2005/0197050 A1* | 9/2005 | Prasad | B24B 37/205 451/41 |
| 2011/0053377 A1* | 3/2011 | Ogawa | B24B 37/205 438/692 |
| 2013/0017769 A1* | 1/2013 | Kimura | B24B 37/22 451/533 |

FOREIGN PATENT DOCUMENTS

| | | |
|---|---|---|
| JP | 2009-095945 A | 5/2009 |
| JP | 2010-525956 A | 7/2010 |
| WO | 2008/137033 A1 | 11/2008 |

OTHER PUBLICATIONS

International Search Report (ISR) mailed May 28, 2013, issued for International application No. PCT/JP2013/055516.
A Notice to Submit a Response issued by Korean Intellectual Property Office, mailed Jun. 4, 2015, for Korean counterpart application No. 1020147018250.

* cited by examiner

LAMINATED POLISHING PAD AND METHOD FOR PRODUCING SAME

This application is the U.S. National Phase under 35 U.S.C. §371 of International Application PCT/JP2013/055516, filed Feb. 28, 2013, which claims priorities to Japanese Patent Application No. 2012-090241, filed Apr. 11, 2012. The International Application was published under PCT Article 21(2) in a language other than English.

TECHNICAL FIELD

The present invention relates to a laminated polishing pad used in planarizing an uneven surface of a material to be polished, such as a semiconductor wafer, by chemical mechanical polishing (CMP) and method for producing same, and in particular to a laminated polishing pad having a window (light transmitting region) for detection of a polished state or the like by optical means and method for producing same.

BACKGROUND ART

Production of a semiconductor device involves a step of forming an electroconductive film on a surface of a semiconductor wafer (hereinafter also referred to as a wafer) to form a wiring layer by photolithography, etching or the like; a step of forming an interlaminar insulating film on the wiring layer; and the like; and an uneven surface made of an electroconductive material such as metal and an insulating material is formed on the surface of a wafer by these steps. In recent years, processing for fine wiring and multilayer wiring have been advancing for the purpose of higher integration of semiconductor integrated circuits, and accordingly techniques of planarizing an uneven surface of a wafer have become important.

As the method of planarizing an uneven surface of a wafer, a CMP method is generally used. CMP is a technique in which while the surface of a wafer to be polished is pressed against a polishing surface of a polishing pad, the surface of the wafer is polished with an abrasive in the form of slurry having abrasive grains dispersed therein (hereinafter, referred to as slurry).

As shown in FIG. 1, a polishing apparatus used generally in CMP is provided, for example, with a polishing platen 2 for supporting a polishing pad 1; a supporting stand (polishing head) 5 for supporting a polished material (wafer) 4; a substrate material for uniformly pressurizing a wafer; and a mechanism of feeding an abrasive 3. The polishing pad 1 is fitted with the polishing platen 2, for example, by sticking with a double-sided tape. The polishing platen 2 and the supporting stand 5 are provided with rotating shafts 6 and 7, respectively, and are arranged such that the polishing pad 1 and the polished material 4, both of which are supported by them, are opposed to each other. The supporting stand 5 is provided with a pressurizing mechanism for pressing the polished material 4 against the polishing pad 1.

When such CMP is conducted, there is a problem of judging the planarity of wafer surface. That is, the point in time when desired surface properties or planar state are reached is required to be detected. With respect to the thickness of an oxide film, polishing speed and the like, the following has been conventionally conducted that a test wafer is periodically treated, the results are confirmed, and thereafter a wafer to be a product is subjected to a polishing treatment.

In this method, however, the treatment time of a test wafer and the cost for the treatment are wasteful, and the test wafer not subjected to processing at all in advance and a product wafer are different in polishing results due to a loading effect unique to CMP, and accurate prediction of processing results is difficult without actual processing of the product wafer.

Accordingly, there has been a need in recent years for a method capable of in situ detection of the point in time when desired surface properties and thickness are attained at the time of CMP processing, in order to solve the problem described above. In such detection, various methods are used. From the viewpoints of measurement accuracy and spatial resolution in non-contract measurement, optical detection means comes to be used mainly.

The optical detection means is specifically a method of detecting the end-point of polishing by irradiating a wafer via a polishing pad through a window (light transmitting region) with light beam, and monitoring interference signal generated by reflection of the light beam.

As a method of detecting the end-point of polishing by such optical means, and a polishing pad used in the method, various methods and polishing pads have been proposed.

Conventional polishing pads for use in high-precision polishing are generally produced using a polyurethane resin foam sheet. Unfortunately, such a polyurethane resin foam sheet has insufficient cushioning properties and therefore can hardly apply uniform pressure to the entire surface of a wafer, though it has high local-planarization performance. In general, therefore, a soft cushion layer is additionally provided on the back side of such a polyurethane resin foam sheet, and the resulting laminated polishing pad is used for polishing.

However, conventional laminated polishing pads, which usually have a polishing layer and a cushion layer bonded together with a double-sided tape, have a problem in that a slurry can enter between the polishing layer and the cushion layer during polishing, so that the durability of the double-sided tape can decrease and delamination can easily occur between the polishing layer and the cushion layer.

Examples of proposed methods to solve this problem include the techniques described below.

Patent Document 1 discloses that a plastic film and a polishing pad are bonded together with a reactive hot-melt adhesive.

Patent Document 2 discloses a polishing pad including a base layer and a polishing layer bonded together with a hot-melt adhesive layer.

Patent Document 3 discloses a technique for forming a polishing pad including a polishing layer and a base layer bonded together with a double-sided tape, wherein a water blocking layer including a hot-melt adhesive is provided between the back side of the polishing layer and the double-sided tape to block a polishing slurry.

Patent Document 4 discloses a polishing pad including a polishing layer and a lower layer, which are bonded together with a hot-melt adhesive containing EVA.

Ply separation can be prevented by using a hot-melt adhesive. Unfortunately, when a hot-melt adhesive is used in the process of manufacturing a laminated polishing pad having a light transmitting region, the following problems can occur. (1) The manufacturing process can be complicated. (2) It can be difficult to place the light transmitting region at a desired position. (3) In the process of manufacturing the laminated polishing pad, the light transmitting region can be scratched or an adhesive layer or a resin film on the lower side of the light transmitting region can be scratched, or foreign particles can be deposited on the adhesive layer or the resin film, so that optical detection accuracy can decrease.

PRIOR ART DOCUMENTS

Patent Documents

Patent Document 1: JP-A-2002-224944
Patent Document 2: JP-A-2005-167200
Patent Document 3: JP-A-2009-95945
Patent Document 4: JP-A-2010-525956

SUMMARY OF THE INVENTION

Problems to be Solved by the Invention

It is an object of the invention to provide a method for simply manufacturing a laminated polishing pad that can achieve a high level of optical detection accuracy and resist delamination between its polishing layer and its support or intermediate layer even when heated to high temperature during long-time polishing.

Means for Solving the Problems

The present inventors have intensively studied so as to solve the above problems and as a result, have found that the objects can be achieved by the below-mentioned method for manufacturing a laminated polishing pad, thereby leading to complete the present invention.

That is, the present invention relates to a method for manufacturing a laminated polishing pad, comprising the steps of: forming a polishing layer by providing a light transmitting region in an opening A of a polishing region; providing an adhesive member X on one side of the polishing layer, wherein the adhesive member X contains a hot-melt adhesive; providing a removable protective member on a part of the adhesive member X corresponding to the light transmitting region; bonding a support layer to the adhesive member X on which the removable protective member is provided; and removing a part of the support layer corresponding to the light transmitting region and also removing the removable protective member to form an opening B.

Moreover, the present invention relates to a method for manufacturing a laminated polishing pad, comprising the steps of: forming a polishing layer by providing a light transmitting region in an opening A of a polishing region; bonding the polishing layer and an intermediate layer together with an adhesive member X containing a hot-melt adhesive; providing an adhesive member Y on the intermediate layer; providing a removable protective member on a part of the adhesive member Y corresponding to the light transmitting region; bonding a support layer to the adhesive member Y on which the removable protective member is provided; and removing a part of the support layer corresponding to the light transmitting region and also removing the removable protective member to form an opening B.

Furthermore, the present invention relates to a method for manufacturing a laminated polishing pad, comprising the steps of: forming a polishing layer by providing a light transmitting region in an opening A of a polishing region; bonding the polishing layer and an intermediate layer together with an adhesive member X containing a hot-melt adhesive; providing a removable protective member on a part of the intermediate layer corresponding to the light transmitting region; providing an adhesive member Y on the intermediate layer on which the removable protective member is provided; bonding a support layer to the adhesive member Y; and removing parts of the adhesive member Y and the support layer corresponding to the light transmitting region and also removing the removable protective member to form an opening B.

The intermediate layer is preferably a resin film.

The adhesive member X is preferably an adhesive layer containing a polyester-based hot-melt adhesive or a double-sided adhesive tape including a substrate and adhesive layers provided on both sides of the substrate, wherein the adhesive layers contain a polyester-based hot-melt adhesive, and the polyester-based hot-melt adhesive preferably contains 100 parts by weight of a polyester resin as a base polymer and 2 to 10 parts by weight of an epoxy resin having two or more glycidyl groups per molecule.

When 2 to 10 parts by weight of the epoxy resin having two or more glycidyl groups per molecular is added to 100 parts by weight of the polyester resin as a base polymer, the polyester resin can be crosslinked. In this case, the adhesive member X can have improved durability against "shearing," which occurs during polishing, even when high temperature is reached due to long-time polishing, so that the resulting laminated polishing pad can resist delamination between its polishing layer and its support or intermediate layer.

If the epoxy resin is added in an amount of less than 2 parts by weight, the adhesive member X can have insufficient durability against "shearing," which occurs during polishing, when high temperature is reached due to long-time polishing, so that delamination between the polishing layer and the support or intermediate layer can be more likely to occur. On the other hand, if the epoxy resin is added in an amount of more than 10 parts by weight, the adhesive layer can have too high hardness and lower tackiness, so that delamination between the polishing layer and the support or intermediate layer can be more likely to occur.

The polyester resin as a base polymer is preferably a crystalline polyester resin. Using the crystalline polyester resin improves the chemical resistance to slurry, so that the adhesive layer can hardly decrease in adhering strength.

The invention is also directed to a laminated polishing pad obtained by the above manufacturing method, and to a method for producing a semiconductor device, including the step of polishing the surface of a semiconductor wafer with the laminated polishing pad.

Effect of the Invention

The manufacturing method of the invention makes it possible to obtain a laminated polishing pad that resists delamination between the polishing layer and the support or intermediate layer even when heated to high temperature during long-time polishing. The manufacturing method of the invention also makes it possible to easily place the light transmitting region at a desired position. Additionally, in the manufacturing method of the invention, the removable protective member is used to protect a part of the adhesive member corresponding to the light transmitting region, when the adhesive member is provided on the lower side of the light transmitting region. In the manufacturing process, therefore, the part of the adhesive member is not scratched, and foreign particles are not deposited on the part of the adhesive member. This makes it possible to effectively prevent a reduction in optical detection accuracy.

MODE FOR CARRYING OUT THE INVENTION

Figure 1:
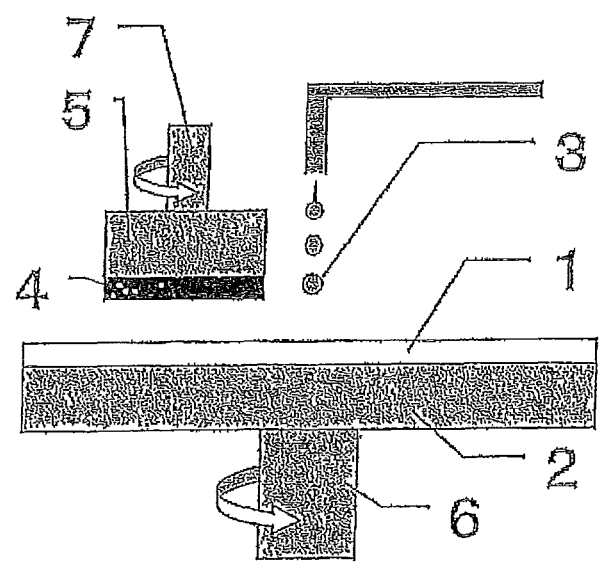
FIG. 1 is a schematic diagram showing an example of a polishing apparatus for use in CMP polishing.

A method of the invention for manufacturing a laminated polishing pad will be described with reference to FIG. 2.

First, a polishing layer 11 is formed by providing a light transmitting region 10 in an opening A 9 of a polishing region 8.

The polishing region 8 may be made of a foamed material or a non-foamed material. Preferably, it is made of a foamed material having fine cells. The polishing region may be made of, for example, the material may be one of or a blend of two or more of polyurethane resin, polyester resin, polyamide resin, acrylic resin, polycarbonate resin, halogen-containing resin (such as polyvinyl chloride, polytetrafluoroethylene and polyvinylidene fluoride etc.), polystyrene, olefin resin (such as polyethylene and polypropylene etc.), epoxy resin, and photosensitive resin. Polyurethane resin is particularly preferred as a material for forming the polishing region because polyurethane resin has good wear resistance and because urethane polymers having desired physical properties can be easily obtained through changing the composition of raw materials in various manners. Hereinafter, the polishing region made of a polyurethane resin foam will be described.

The polyurethane resin contains an isocyanate component, a polyol component (high-molecular-weight polyol, low-molecular-weight polyol etc.) and a chain extender.

As the isocyanate component, a compound known in the field of polyurethane can be used without particular limitation. The isocyanate component includes, for example, aromatic diisocyanates such as 2,4-toluene diisocyanate, 2,6-toluene diisocyanate, 2,2'-diphenyl methane diisocyanate, 2,4'-diphenyl methane diisocyanate, 4,4'-diphenyl methane diisocyanate, 1,5-naphthalene diisocyanate, p-phenylene diisocyanate, m-phenylene diisocyanate, p-xylylene diisocyanate and m-xylylene diisocyanate, aliphatic diisocyanates such as ethylene diisocyanate, 2,2,4-trimethyl hexamethylene diisocyanate and 1,6-hexamethylene diisocyanate, and cycloaliphatic diisocyanates such as 1,4-cyclohexane diisocyanate, 4,4'-dicyclohexyl methane diisocyanate, isophorone diisocyanate and norbornane diisocyanate. These may be used alone or as a mixture of two or more thereof.

As the high-molecular-weight polyol, a compound known in the field of polyurethane can be used without particular limitation. The high-molecular-weight polyol includes, for example, polyether polyols represented by polytetramethylene ether glycol and polyethylene glycol, polyester polyols represented by polybutylene adipate, polyester polycarbonate polyols exemplified by reaction products of polyester glycols such as polycaprolactone polyol and polycaprolactone with alkylene carbonate, polyester polycarbonate polyols obtained by reacting ethylene carbonate with a multivalent alcohol and reacting the resulting reaction mixture with an organic dicarboxylic acid, and polycarbonate polyols obtained by ester exchange reaction of a polyhydroxyl compound with aryl carbonate. These may be used singly or as a mixture of two or more thereof.

Besides the above high-molecular-weight polyol described in the above as a polyol component, it is preferred to concomitantly use a low-molecular-weight polyol such as ethyleneglycol, 1,2-propylene glycol, 1,3-propylene glycol, 1,2-butanediol, 1,3-butanediol, 1,4-butanediol, 2,3-butanediol, 1,6-hexanediol, neopentylglycol, 1,4-cyclohexanedimethanol, 3-methyl-1,5-pentanediol, diethyleneglycol, triethyleneglycol, 1,4-bis(2-hydroxyethoxy)benzene, trimethylolpropane, glycerin, 1,2,6-hexanetriol, pentaerythritol, tetramethylol cyclohexane, methylglucoside, sorbitol, mannitol, dulcitol, sucrose, 2,2,6,6-tetrakis(hydroxymethyl)cyclohexanol, diethanolamine, N-methyldiethanolamine and triethanol amine. Low-molecular-weight polyamine such as ethylenediamine, tolylenediamine, diphenylmethanediamine, and diethylenetriamine may be used. Alcohol amine such as monoethanol amine, 2-(2-aminoethylamino)ethanol and monopropanol amine may be used. These may be used singly or in combination of two or more kinds. The content of the low-molecular-weight polyol, the low-molecular-weight polyamine, or other materials is not particularly limited, and may be appropriately determined depending on the properties required of the polishing pad (polishing layer 11) to be manufactured.

In the case where a polyurethane resin foam is produced by means of a prepolymer method, a chain extender is used in curing of a prepolymer. A chain extender is an organic compound having at least two active hydrogen groups and examples of the active hydrogen group include: a hydroxyl group, a primary or secondary amino group, a thiol group (SH) and the like. Concrete examples of the chain extender include: polyamines such as 4,4'-methylenebis(o-chloroaniline) (MOCA), 2,6-dichloro-p-phenylenediamine, 4,4'-methylenebis(2,3-dichloroaniline), 3,5-bis(methylthio)-2,4-toluenediamine, 3,5-bis(methylthio)-2,6-toluenediamine, 3,5-diethyltoluene-2,4-diamine, 3,5-diethyltoluene-2,6-diamine, trimethylene glycol-di-p-aminobenzoate, polytetramethylene oxide-di-p-aminobenzoate, 4,4'-diamino-3,3', 5,5'-tetraethyldiphenylmethane, 4,4'-diamino-3,3'-diisopropyl-5.5'-dimethyldiphenylmethane, 4,4'-diamino-3, 3',5,5'-tetraisopropyldiphenylmethane, 1,2-bis(2-aminophenylthio)ethane, 4,4'-diamino-3,3'-diethyl-5.5'-dimethyldiphenylmethane, N,N'-di-sec-butyl-4,4'-diaminophenylmethane, 3,3'-diethyl-4,4'-diaminodiphenylmethane, m-xylylenediamine, N,N'-di-sec-butyl-p-phenylenediamine, m-phenylenediamine and p-xylylenediamine; the low-moleculer-weight polyol; and the low-molecular-weight polyamine. The chain extenders described above may be used either alone or in mixture of two kinds or more.

A polyurethane resin foam can be produced by applying a melting method, a solution method or a known polymerization technique, among which preferable is a melting method, consideration being given to a cost, a working environment and the like.

Manufacture of a polyurethane resin foam is enabled by means of either a prepolymer method or a one shot method, of which preferable is a prepolymer method in which an isocyanate-terminated prepolymer is synthesized from an isocyanate component and a polyol component in advance, with which a chain extender is reacted since physical properties of an obtained polyurethane resin is excellent.

Manufacturing methods of a polyurethane resin foam include: a method in which hollow beads are added, a mechanical foaming method, a chemical foaming method and the like.

Particularly, preferred is a mechanical foaming method using a silicone-based surfactant which is a copolymer of polyalkylsiloxane and polyether and has no an active hydrogen group.

A stabilizer such as antioxidant, a lubricant, a pigment, a filler, an antistatic agent and other additives may be added, as needed.

The polyurethane resin foam may be of a closed cell type or an open cell type.

Production of the polyurethane resin foam may be in a batch system where each component is weighed out, introduced into a vessel and mixed or in a continuous production system where each component and a non-reactive gas are continuously supplied to, and stirred in, a stirring apparatus and the resulting forming reaction liquid is transferred to produce molded articles.

A manufacturing method of a polyurethane resin foam may be performed in ways: in one of which a prepolymer which is a raw material from which a polyurethane foam is made is put into a reactor, thereafter a chain extender is mixed into the prepolymer, the mixtue is agitated, thereafter the mixture is cast into a mold with a predetermined size to thereby prepare a block and the block is sliced with a slicer like a planer or a band saw; and in another of which in the step of casting into the mold, a thin sheet may be directly produced. Besides, a still another way may be adopted in which a resin of raw material is melted, the melt is extruded through a T die to thereby mold a polyurethane resin foam directly in the shape of a sheet.

Preferably, a polishing surface of the polishing region 8, which comes into contact with an object to be polished have a asperity structure provided for retaining and refreshing a slurry. A polishing region made of a foam has a number of openings in the polishing surface, and has a function of retaining and refreshing a slurry. By forming an asperity structure on the polishing surface, it is possible to conduct retention and refreshment of the slurry more efficiently, and to prevent the object to be polished from breaking due to adsorption of the material to be polished. The shape of the asperity structure is not particularly limited insofar as it is able to retain and refresh a slurry, and for example, XY grating groove, concentric ring groove, through-hole, non-through-hole, polygonal column, circular cylinder, spiral groove, eccentric ring groove, radial groove, and combination thereof can be recited. These asperity structures generally have regularity, however, groove pitch, groove width, groove depth and the like may be varied by a certain range for achieving desired retention and refreshment of slurry.

The polishing region 8 may have any shape such as a circular shape or an elongated shape. The size of the polishing region may be appropriately adjusted depending on the polishing apparatus to be used. When the polishing region is circular, it may have a diameter of about 30 to about 150 cm, and when the polishing region has an elongated shape, it may have a length of about 5 to about 15 m and a width of about 60 to about 250 cm.

The thickness of the polishing region 8 is generally, but is not limited to, about 0.8 to 4 mm, and preferably 1.2 to 2.5 mm.

Any means may be used to form the opening A 9 in the polishing region 8. For example, the opening A 9 may be formed by a pressing or grinding method using a cutting tool, a method using a laser such as a carbon dioxide laser, or a method including casting a raw material into a mold having the shape of the opening A and curing the material to obtain a molded product. The opening A may be of any size.

The opening A 9 may have any planar shape such as a circular, elliptical, square, rectangular, or polygonal shape. The opening A may also have any cross-sectional shape. The opening A may be tapered from the polishing front surface side to the polishing back surface side so that it can be easy to temporarily fix the light transmitting region into the opening A.

There is no particular limitation on a material for forming the light transmitting region 10. The material to be used is preferably a material which enables optical end-point detection with high accuracy in a state where polishing is carried out and has a light transmittance of 20% or more, and more preferably 50% or more, over the entire range of 400 to 700 nm in wavelength. Examples of such a material include thermosetting resins such as a polyurethane resin, a polyester resin, a phenol resin, a urea resin, a melamine resin, an epoxy resin and an acrylic resin; thermoplastic resins such as a polyurethane resin, a polyester resin, a polyamide resin, a cellulose-based resin, an acrylic resin, a polycarbonate resin, a halogen containing resin (polyvinyl chloride, polytetrafluoroethylene, polyvinylidene fluoride and the like), polystyrene, and an olefinic resin (polyethylene, polypropylene and the like); rubbers such as a butadiene rubber and an isoprene rubber; photocurable resins curable with irradiation of light such as ultraviolet light and an electron beam; and photosensitive resins. The resins may be used alone or in combination of two or more kinds thereof.

The material to be used in the light transmitting region 10 is preferably a material more excellent in cutting property than the material to be used in the polishing region. Particularly preferred is a polyurethane resin having a high wear resistance, which can suppress light scattering in the light transmitting region due to dressing marks during polishing.

There is no particular limitation on the method of preparing the light transmitting region 10, and the light transmitting region can be prepared according to known methods. For example, a method wherein a block of the polyurethane resin is cut in a predetermined thickness by a slicer in a bandsaw system or a planing system, a method that involves casting a resin into a mold having a cavity of predetermined thickness and then curing the resin, a method of using coating techniques and sheet molding techniques, and the like are used.

The light transmitting region 10 may be of any size. Preferably, it has the same size as the opening A 9 of the polishing region 8. The light transmitting region preferably has the same planar shape as the opening A. The light transmitting region preferably has the same cross-sectional shape as the opening A. The light transmitting region may also be tapered from the polishing front surface side to the polishing back surface side so that it can be easy to temporarily fix the light transmitting region into the opening A.

There is no particular limitation on the thickness of the light transmitting region 10, and it is preferably that a thickness thereof is equal to or less than that of the polishing region. When the thickness of the light transmitting region is more than that of the polishing region, there is a possibility that the material to be polished is scared by a protruded portion during polishing. Since the light transmitting region is deformed by stress acting thereon upon polishing to have an optically large strain, there is a possibility that polishing end-point detection accuracy is reduced. On the other hand, when the thickness of the light transmitting region is excessively thin, durability is insufficient and a large recess occurs on the upper surface of the light transmitting region to collect a lot of slurry, thereby causing a possibility to reduce optical end-point detection accuracy.

Examples of methods for providing the light transmitting region 10 in the opening A 9 include, but are not limited to, (1) a method including fitting the light transmitting region 10 into the opening A 9 and bonding the surfaces of the polishing resin 8 and the light transmitting region 10 together with a removable pressure-sensitive adhesive tape and (2) a method including casting a light transmitting region-forming material into the opening A 9 and curing the material to form the light transmitting region 10.

Subsequently, an adhesive member X 12 containing a hot-melt adhesive is provided on one side of the polishing layer 11. In this step, the light transmitting region 10 is bonded to the adhesive member X 12.

The adhesive member X 12 may be, for example, an adhesive layer containing a hot-melt adhesive. The adhesive layer preferably has a thickness of 10 to 200 μm, more preferably 25 to 125 μm.

Alternatively, the adhesive member X 12 may be a double-sided adhesive tape including a substrate and adhesive layers of the above type provided on both sides of the substrate. The substrate can prevent a slurry from infiltrating into the support layer side so that delamination between the support layer and the adhesive layer can be prevented.

Examples of the substrate include a polyester film such as a polyethylene terephthalate film or a polyethylene naphthalate film; a polyolefin film such as a polyethylene film or a polypropylene film; and a nylon film. Among them, a polyester film is preferably used because of its high ability to prevent water infiltration.

The surface of the substrate may be subjected to an adhesion-facilitating treatment such as a corona treatment or a plasma treatment.

The thickness of the substrate is preferably, but not limited to, 10 to 180 μm, in view of transparency, flexibility, stiffness, and other properties.

When the double-sided tape is used, the thickness of the adhesive layer is preferably from 10 to 200 μm, more preferably from 25 to 125 μm.

The hot-melt adhesive may be of any known type. Preferably, a polyester-based hot-melt adhesive is used.

Preferably, the polyester-based hot-melt adhesive contains at least a polyester resin as a base polymer and an epoxy resin having two or more glycidyl groups per molecule, in which the epoxy resin is a crosslinking component.

The polyester resin may be any known polyester resin which is obtained by condensation polymerization of an acid and a polyol or other polymerization processes. In particular, the polyester resin is preferably a crystalline polyester resin.

Examples of the acid include aromatic dicarboxylic acids, aliphatic dicarboxylic acids, and alicyclic dicarboxylic acids, etc. These may be used alone or in combination of two or more.

Examples of aromatic dicarboxylic acids include terephthalic acid, isophthalic acid, phthalic anhydride, α-naphthalene dicarboxylic acid, β-naphthalene dicarboxylic acid, and their ester forms, etc.

Examples of aliphatic dicarboxylic acids include succinic acid, glutaric acid, adipic acid, pimelic acid, suberic acid, azelaic acid, sebacic acid, undecylenic acid, dodecanedioic acid, and their ester forms, etc.

Examples of alicyclic dicarboxylic acids include 1,4-cyclohexane dicarboxylic acid, tetrahydrophthalic anhydride, hexahydrophthalic anhydride, etc.

An unsaturated acid such as maleic acid, fumaric acid, or dimer acid, a polycarboxylic acid such as trimellitic acid or pyromellitic acid, or other acids may also be used as the acid in combination with any of the above acids.

Examples of the polyol include dihydric alcohols such as aliphatic glycols and alicyclic glycols, and polyhydric alcohols. These may be used alone or in combination of two or more.

Examples of aliphatic glycols include ethylene glycol, 1,2-propylene glycol, 1,3-propylene glycol, 1,3-butanediol, 1,4-butanediol, 1,5-pentanediol, 1,6-hexanediol, 1,8-octanediol, 1,9-nonanediol, neopentyl glycol, 3-methylpentanediol, 2,2,3-trimethylpentanediol, diethylene glycol, triethylene glycol, dipropylene glycol, etc.

Examples of alicyclic glycols include 1,4-cyclohexanedimethanol, hydrogenated bisphenol A, etc.

Examples of polyhydric alcohols include glycerin, trimethylolethane, trimethylolpropane, pentaerythritol, etc.

The crystalline polyester resin can be synthesized by known methods. Examples include melt polymerization methods including adding raw materials and a catalyst and heating the mixture at a temperature equal to or higher than the melting point of the desired product, solid-phase polymerization methods including performing polymerization at a temperature equal to or lower than the melting point of the desired product, and solution polymerization methods using a solvent, etc. Any of these methods may be used.

The crystalline polyester resin preferably has a melting point of 100 to 200° C. If the melting point is lower than 100° C., the adhesive strength of the hot-melt adhesive can be lowered by heat generated during polishing. If the melting point is higher than 200° C., a higher temperature will be needed to melt the hot-melt adhesive, which may warp the laminated polishing pad and tend to have an adverse effect on the polishing characteristics.

The crystalline polyester resin preferably has a number average molecular weight of 5,000 to 50,000. If the number average molecular weight is less than 5,000, the hot-melt adhesive may have lower mechanical characteristics, so that a sufficient level of tackiness and durability may fail to be obtained. If the number average molecular weight is more than 50,000, a production failure such as gelation may occur in the process of synthesizing the crystalline polyester resin, or the hot-melt adhesive may tend to have lower performance.

Examples of the epoxy resin include aromatic epoxy resins such as bisphenol A type epoxy resins, brominated bisphenol A type epoxy resins, bisphenol F type epoxy resins, bisphenol AD type epoxy resins, stilbene type epoxy resins, biphenyl type epoxy resins, bisphenol A novolac type epoxy resins, cresol novolac type epoxy resins, diaminodiphenylmethane type epoxy resins, and polyphenyl-based epoxy resins such as tetrakis(hydroxyphenyl)ethane-based epoxy resins, fluorene-containing epoxy resins, and epoxy resins containing a triglycidyl isocyanurate moiety or a heteroaromatic ring (such as a triazine ring); and non-aromatic epoxy resins such as aliphatic glycidyl ether type epoxy resins, aliphatic glycidyl ester type epoxy resins, alicyclic glycidyl ether type epoxy resins, and alicyclic glycidyl ester type epoxy resins. These may be used alone or in combination of two or more.

Among them, cresol novolac type epoxy resins are preferably used in view of tackiness to the polishing layer 10 during polishing.

The epoxy resin is necessarily added in an amount of 2 to 10 parts by weight, preferably in an amount of 3 to 7 parts by weight, to 100 parts by weight of the polyester resin as a base polymer.

The polyester-based hot-melt adhesive may also contain known additives such as a softener such as an olefin resin, a tackifier, a filler, a stabilizer, and a coupling agent. The adhesive may also contain a known inorganic filler such as talc and other materials.

The polyester-based hot-melt adhesive can be prepared by mixing at least the polyester resin and the epoxy resin and optional materials by any method. For example, the polyester-based hot-melt adhesive can be prepared by mixing the respective raw materials using an extruder such as a mono-screw extruder, a co-rotating intermeshing parallel twin screw extruder, a counter-rotating intermeshing parallel twin screw extruder, a counter-rotating intermeshing inclined twin screw extruder, a non-intermeshing twin screw extruder, an incompletely intermeshing twin screw extruder, a co-kneader extruder, a planetary gear extruder, a transfer mixing extruder, a ram extruder, or a roller extruder, or a kneader, etc.

The polyester-based hot-melt adhesive preferably has a melting point of 100 to 200° C.

The polyester-based hot-melt adhesive preferably has a specific gravity of 1.1 to 1.3.

The polyester-based hot-melt adhesive preferably has a melt flow index of 16 to 26 g/10 minutes under the conditions of 150° C. and a load of 2.16 kg.

The polyester-based hot-melt adhesive may be used in any form, such as in the form of a pellet, a powder, a sheet, a film, or a solvent solution. In the invention, however, the polyester-based hot-melt adhesive is preferably used in the form of a sheet or a film.

Examples of methods for providing the adhesive member X 12 containing a hot-melt adhesive on one side of the polishing layer 11 include, but are not limited to, (1) a method including placing the adhesive member X 12 containing a hot-melt adhesive on the polishing layer 11, heating the hot-melt adhesive with a heater to melt or soften the hot-melt adhesive, and then curing the hot-melt adhesive and (2) a method including applying a heat-melted hot-melt adhesive to the polishing layer 11 and then curing the melted hot-melt adhesive. The adhesive member X 12 may be temporarily or completely bonded to the polishing layer 11. If temporarily bonded, the adhesive member X 12 will be completely bonded in a later step.

Subsequently, a removable protective member 13 is provided on a part of the adhesive member X 12 corresponding to the light transmitting region 10. The removable protective member 13 may be of any type as long as the part of the adhesive member X 12 corresponding to the light transmitting region 10 can be covered with it. Preferably, a heat-resistant, removable resin sheet (such as a fluororesin sheet or a silicone resin sheet) is preferably used as the removable protective member 13.

The removable protective member 13 may be of any size. Preferably, the size of the removable protective member 13 is the same as or smaller than that of the light transmitting region 10.

The removable protective member 13 preferably has a thickness of 150 μm or less. If the thickness is more than 150 μm, the edge of the removable protective member 13 can form a step (space) in the later step of bonding a support layer 14 to the adhesive member X 12, so that the adhesion between the adhesive member X 12 and the support layer 14 can decrease at that part.

Subsequently, the support layer 14 is bonded to the adhesive member X 12 on which the removable protective member 13 is provided.

The support layer 14 is provided to supplement the characteristics of the polishing layer 11. The support layer to be used may be a layer (cushion layer) having an elastic modulus lower than that of the polishing layer or may be a layer (high modulus layer) having an elastic modulus higher than that of the polishing layer. The cushion layer is necessary for CMP to achieve both good planarity and good uniformity, which are usually in a trade-off relationship. The term "planarity" refers to the flatness of a patterned part formed by polishing an object to be polished having fine irregularities, which are produced in a patterning process. The term "uniformity" refers to the entire uniformity of an object to be polished. The characteristics of the polishing layer contribute to an improvement in planarity, and the characteristics of the cushion layer contribute to an improvement in uniformity. The high modulus layer is used to improve the planarizing characteristics of the polishing pad when a relatively soft polishing layer is used in order to suppress scratching in CMP. The use of the high modulus layer makes it possible to suppress excessive polishing of the edge of an object to be polished.

Examples of the cushion layer include nonwoven fiber fabrics such as polyester nonwoven fabrics, nylon nonwoven fabrics, and acrylic nonwoven fabrics; resin impregnated nonwoven fabrics such as polyurethane impregnated polyester nonwoven fabrics; polymeric resin foams such as polyurethane foams and polyethylene foams; rubber resins such butadiene rubber and isoprene rubber; and photosensitive resins, etc.

Examples of the high modulus layer include polyester films such as polyethylene terephthalate films and polyethylene naphthalate films; polyolefin films such as polyethylene films and polypropylene films; and nylon films, etc.

The support layer 14 may be bonded to the adhesive member X 12 by any method. For example, they may be bonded together by a method including placing the support layer 14 on the adhesive member X 12, melting the hot-melt adhesive in the adhesive member X 12 by heating with a heater, and then curing the melted hot-melt adhesive. After the holt melt adhesive is melted by heating, the support layer may be pressed against the melted hot-melt adhesive and bonded to it. If the adhesive member X 12 is temporarily bonded to the polishing layer 11, the adhesive member X 12 and the polishing layer 11 will be completely bonded together in this step.

A pressure-sensitive adhesive member 15 (such as a pressure-sensitive adhesive layer or a double-sided adhesive tape) for bonding the laminated polishing pad to a polishing surface plate may also be provided on one side of the support layer 14.

Subsequently, a part of the support layer 14 corresponding to the light transmitting region 10 is removed, and the removable protective member 13 is also removed, so that an opening B 16 for transmitting light is formed and a laminated polishing pad 1 is obtained. When the pressure-sensitive adhesive member 15 is provided, a part of the pressure-sensitive adhesive member 15 corresponding to the light transmitting region 10 is also removed.

Examples of methods for removing the support layer 14 (and the pressure-sensitive adhesive layer 15) include, but not limited to, a method of removing the part by cutting with a blade or other tools and a method of removing the part by laser beam machining.

In the manufacturing method of the invention, the removable protective member 13 is used to protect a part of the adhesive member X 12 corresponding to the light transmitting region 10 when the adhesive member X 12 is provided on the lower side of the light transmitting region 10. Therefore, scratching of the part or deposition of foreign particles on the part is prevented in the process of removing the support layer 14 (and the pressure-sensitive adhesive member 15). This makes it possible to effectively prevent a reduction in optical detection accuracy.

Another method of the invention for manufacturing a laminated polishing pad will be described with reference to FIG. 3. The same features as those in the above laminated polishing pad-manufacturing method will not be described again in detail.

First, a polishing layer 11 is formed by providing a light transmitting region 10 in an opening A 9 of a polishing region 8.

Subsequently, the polishing layer 11 and an intermediate layer 17 are bonded together with an adhesive member X 12 containing a hot-melt adhesive.

The intermediate layer 17 is provided to prevent a slurry from infiltrating into the support layer 14 side so that delamination between the support layer 14 and an adhesive member Y 18 can be prevented.

Examples of the intermediate layer 17 include a polyester film such as a polyethylene terephthalate film or a polyethylene naphthalate film; a polyolefin film such as a polyethylene film or a polypropylene film; and a nylon film. Among them, a polyester film is preferably used because of its high ability to prevent water infiltration.

Examples of methods for bonding the polishing layer 11 and the intermediate layer 17 together with the adhesive member X 12 containing a hot-melt adhesive include, but are not limited to, (1) a method including placing the adhesive member X 12 containing a hot-melt adhesive on the intermediate layer 17 (or the polishing layer 11), melting the hot-melt adhesive by heating with a heater, then placing the polishing layer 11 (or the intermediate layer 17) on the melted adhesive, and curing the melted adhesive; (2) a method including applying a heat-melted hot-melt adhesive to the intermediate layer 17 (or the polishing layer 11), then placing the polishing layer 11 (or the intermediate layer 17) on the melted adhesive, and curing the melted adhesive; and (3) a method including laminating the intermediate layer 17, the adhesive member X 12 containing a hot-melt adhesive, and the polishing layer 11, heating the resulting laminate to melt the hot-melt adhesive, and then curing the melted adhesive. The respective components may be stacked and then bonded together by pressing. The method (1) or (2) is preferred in order to prevent thermal deformation of the laminated polishing pad.

Subsequently, an adhesive member Y 18 is provided on the intermediate layer 17. The adhesive member Y 18 may be a common adhesive layer or a common double-sided adhesive tape, or may be an adhesive member containing a hot-melt adhesive as mentioned above.

Subsequently, a removable protective member 13 is provided on a part of the adhesive member Y 18 corresponding to the light transmitting region 10.

Subsequently, a support layer 14 is bonded to the adhesive member Y 18 on which the removable protective member 13 is provided. A pressure-sensitive adhesive member 15 (such as a pressure-sensitive adhesive layer or a double-sided adhesive tape) for bonding the laminated polishing pad to a polishing surface plate may also be provided on one side of the support layer 14.

Subsequently, a part of the support layer 14 corresponding to the light transmitting region 10 is removed, and the removable protective member 13 is also removed, so that an opening B 16 for transmitting light is formed and a laminated polishing pad 1 is obtained. When the pressure-sensitive adhesive member 15 is provided, apart of the pressure-sensitive adhesive member 15 corresponding to the light transmitting region 10 is also removed.

Figure 4:
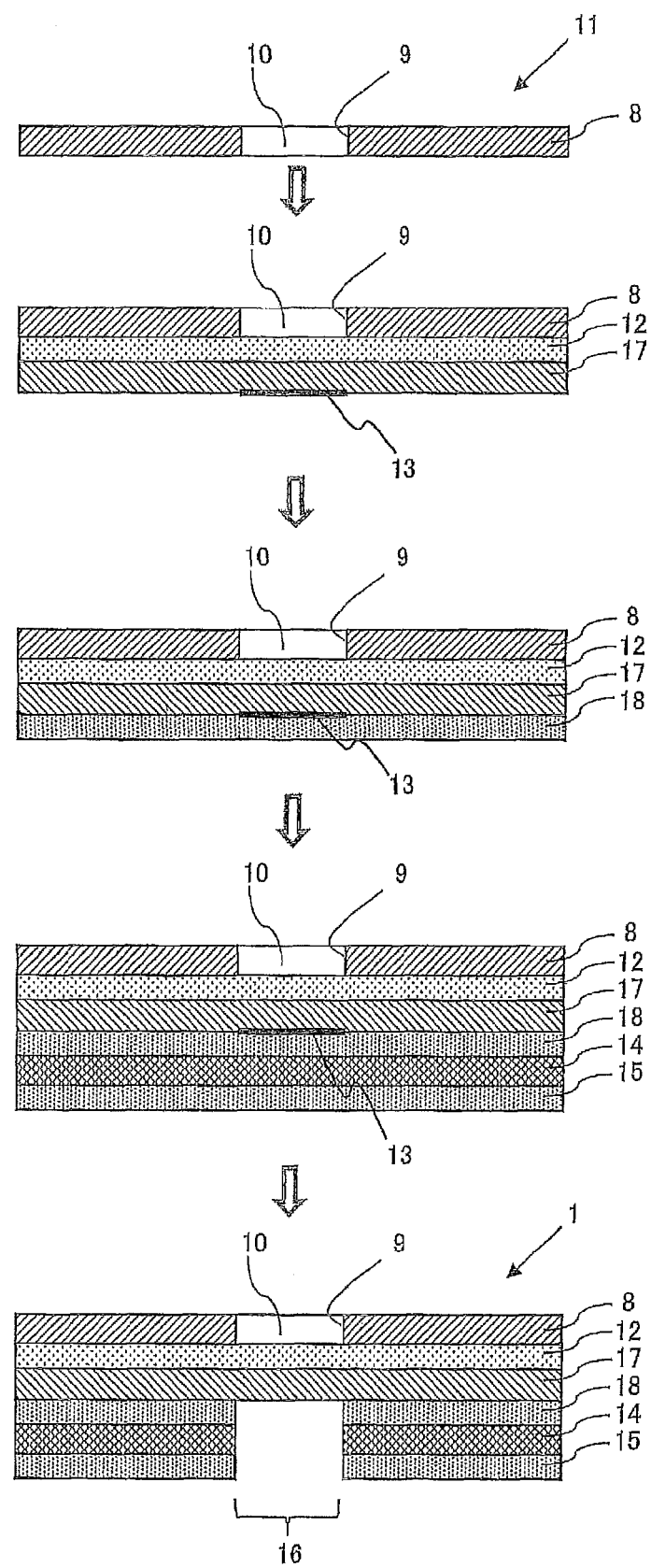
FIG. 4 is a schematic process drawing showing a further example of the method of the invention for manufacturing a laminated polishing pad.

A further method of the invention for manufacturing a laminated polishing pad will be described with reference to FIG. 4. The same features as those in the above laminated polishing pad-manufacturing method will not be described again in detail.

First, a polishing layer 11 is formed by providing a light transmitting region 10 in an opening A 9 of a polishing region 8.

Subsequently, the polishing layer 11 and an intermediate layer 17 are bonded together with an adhesive member X 12 containing a hot-melt adhesive.

Subsequently, a removable protective member 13 is provided on a part of the intermediate layer 17 corresponding to the light transmitting region 10.

Subsequently, an adhesive member Y 18 is provided on the intermediate layer 17 on which the removable protective member 13 is provided.

Subsequently, a support layer 14 is bonded to the adhesive member Y 18. A pressure-sensitive adhesive member 15 may also be provided on one side of the support layer 14.

Subsequently, parts of the adhesive member Y 18 and the support layer 14 corresponding to the light transmitting region 10 are removed, and the removable protective member 13 is also removed, so that an opening B 16 for transmitting light is formed and a laminated polishing pad 1 is obtained. When the pressure-sensitive adhesive member 15 is provided, a part of the pressure-sensitive adhesive member 15 corresponding to the light transmitting region 10 is also removed.

The laminated polishing pad 1 of the invention resists delamination between the polishing layer 11 and the support layer 14 or the intermediate layer 17 even when heated to high temperature during long-time polishing, and also achieves a high level of optical detection accuracy.

A semiconductor device is fabricated after operation in a step of polishing a surface of a semiconductor wafer with a laminated polishing pad. The term, a semiconductor wafer, generally means a silicon wafer on which a wiring metal and an oxide layer are stacked. No specific limitation is imposed on a polishing method of a semiconductor wafer or a polishing apparatus, and polishing is performed with a polishing apparatus equipped, as shown in FIG. 1, with a polishing platen 2 supporting a laminated polishing pad 1, a polishing head 5 holding a semiconductor wafer 4, a backing material for applying a uniform pressure against the wafer and a supply mechanism of a polishing agent 3. The laminated polishing pad 1 is mounted on the polishing platen 2 by adhering the pad to the platen with a double-sided adhesive tape. The polishing platen 2 and the polishing head 5 are disposed so that the laminated polishing pad 1 and the semiconductor wafer 4 supported or held by them oppositely face each other and provided with respective rotary shafts 6 and 7. A pressure mechanism for pressing the semiconductor wafer 4 to the laminated polishing pad 1 is installed on the polishing head 5 side. During polishing, the semiconductor wafer 4 is polished by being pressed against the laminated polishing pad 1 while the polishing platen 2 and the polishing head 5 are rotated and a slurry is fed. No specific limitation is placed on a flow rate of the slurry, a polishing load, a polishing platen rotation number and a wafer rotation number, which are properly adjusted.

Protrusions on the surface of the semiconductor wafer 4 are thereby removed and polished flatly. Thereafter, a semiconductor device is produced therefrom through dicing, bonding, packaging etc. The semiconductor device is used in an arithmetic processor, a memory etc.

EXAMPLES

Description will be given of the invention with examples, while the invention is not limited to description in the examples.

[1 Methods for Measurement and Evaluation]

(Measurement of Melting Point)

The melting point of the polyester-based hot-melt adhesive was measured at a rate of temperature rise of 20° C./minute using TOLEDO DSC822 (manufactured by Mettler-Toledo International Inc.).

(Measurement of Specific Gravity)

The measurement was performed according to JIS Z 8807-1976. A 4 cm×8.5 cm adhesive layer strip (of arbitrary thickness) was cut from the polyester-based hot-melt adhesive and used as a sample for the specific gravity measurement. The sample was allowed to stand in an environment at a temperature of 23° C.±2° C. and a humidity of 50%±5% for 16 hours. The sample was measured for specific gravity using a specific gravity meter (manufactured by Sartorius AG).

(Measurement of Melt Flow Index (MI))

The melt flow index of the polyester-based hot-melt adhesive was measured according to ASTM-D-1238 under the conditions of 150° C. and 2.16 kg.

(Measurement of Shearing Stress)

Three 25 mm×25 mm sample pieces were cut from the resulting laminated polishing pad. The polishing layer and the support layer of each sample were pulled from each other at a pulling rate of 300 mm/minute when the shearing stress (N/25 mm square) was measured. Table 1 shows the average of the measurements for the three samples. In the measurement, the samples were also observed for the state of peeling. Also after polishing was performed for 60 hours using the resulting laminated polishing pad under the conditions shown below, the shearing stress was measured using the same method, and the state of peeling was observed.

(Evaluation of the Condition of Laminated Polishing Pad after 60 Hour Polishing)

In a polishing machine SPP600S (manufactured by Okamoto Machine Tool Works, Ltd.), 8-inch silicon wafers each having a 10,000 angstroms tungsten film formed thereon were polished for 60 hours (60 seconds per wafer) with the prepared laminated polishing pad while the polished wafer was replaced with new one. Subsequently, the state of adhesion between the layers of the laminated polishing pad and the state of the back side of the light transmitting region were visually observed.

The polishing conditions were as follows. W2000 (manufactured by Cabot Corporation) was diluted twice with ultrapure water. Two % by weight of hydrogen peroxide water was added to the resulting dilution. The resulting slurry was added at a flow rate of 150 ml/minute during the polishing, in which the polishing load, the polishing platen rotation speed, and the wafer rotation speed were 5 psi, 120 rpm, and 120 rpm, respectively. Before the polishing, the surface of the polishing pad was dressed for 20 seconds using a dresser (Type M100 manufactured by Asahi Diamond Industrial Co., Ltd.). The dressing conditions were as follows: a dressing load of 10 g/cm$^2$, a polishing platen rotation speed of 30 rpm, and a dresser rotation speed of 15 rpm.

Example 1

Preparation of Light Transmitting Region

Polyester polyol (having a number average molecular weight of 2,400) (128 parts by weight) made of adipic acid, hexanediol and ethylene glycol was mixed with 30 parts by weight of 1,4-butanediol, and then the temperature of the mixed solution was controlled to 70° C. To this mixed solution, 100 parts by weight of 4,4'-diphenylmethane diisocyanate controlled to the temperature of 70° C. in advance, followed by stirring for about 1 minute. Then, the mixed solution was poured into a vessel maintained at 100° C. and post curing was carried out at 100° C. for 8 hours to prepare a polyurethane resin. Using the prepared polyurethane resin, a light transmitting region (measuring 56 mm×20 mm, and 1.25 mm in thickness) was prepared by injection molding.

Preparation of Polishing Region

In a reaction vessel, 100 parts by weight of a polyether-based prepolymer (Adiprene L-325, manufactured by Uniroyal Chemical Corporation, with an NCO concentration of 2.22 meq/g) was mixed with 3 parts by weight of a silicone-based nonionic surfactant (SH192, manufactured by Dow Corning Toray Silicone Co., Ltd.), and then the temperature of the mixture was controlled at 80° C. The mixture was vigorously stirred at a rotation number of 900 rpm for about 4 minutes with a stirring blade so that air bubbles were incorporated into the reaction system. To the reaction system, 26 parts by weight of 4,4'-methylenebis(o-chloroaniline) (IHARACUAMINE MT, manufactured by IHARA CHEMICAL INDUSTRY CO., LTD.) melted at 120° C. in advance was added. Thereafter, the reaction system was continuously stirred for about 1 minute and the reaction solution was poured into a pan type open mold. When the reaction solution lost fluidity, it was put into an oven and postcured at 110° C. for 6 hours to obtain a polyurethane resin foam block. The polyurethane resin foam block was sliced with a bandsaw type slicer (manufactured by Fecken-Kirfel) to obtain a polyurethane resin foam sheet (having a specific gravity of 0.86 and a hardness D of 52 degrees). Then, the sheet was surface-buffed to a predetermined thickness with a buffing machine (manufactured by AMITEC Corporation) to obtain a sheet with an adjusted thickness precision (having a thickness of 1.27 mm). Using a recessing machine (manufactured by TohoKoki Co., Ltd.), concentric circular grooves (each measuring 0.25 mm in groove width, 0.45 mm in groove depth, and 1.5 mm in groove pitch) were formed on the surface of the buff-treated sheet. The sheet was punched into a disk with a size of 60 cm in diameter. Thereafter, an opening A (measuring 56 mm×20 mm) was formed at a position which was about 12 cm away from the center of the punched sheet, to prepare a polishing region.

Preparation of Laminated Polishing Pad

Figure 2:
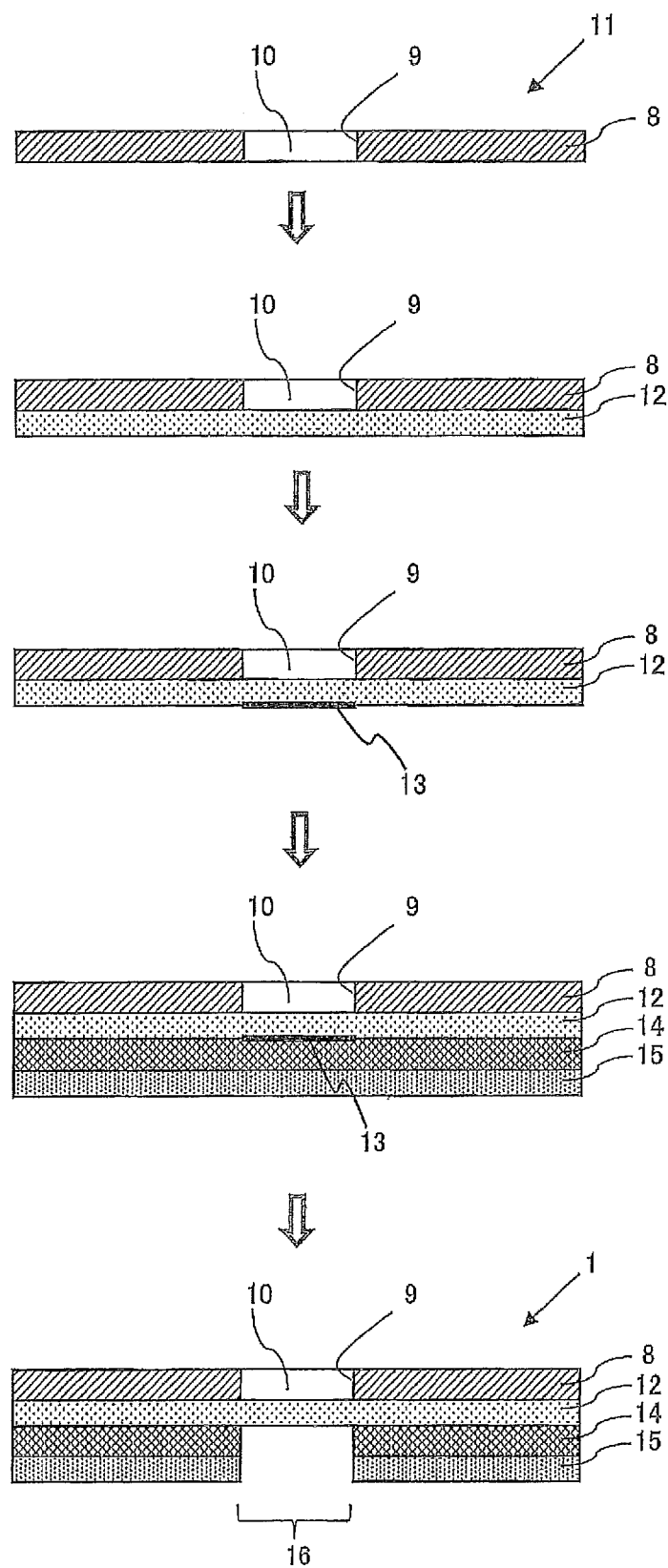
FIG. 2 is a schematic process drawing showing an example of the method of the invention for manufacturing a laminated polishing pad.

A laminated polishing pad was prepared by the method shown in FIG. 2. First, a light transmitting region was inserted into the opening A of a polishing region and temporarily fixed, so that a polishing layer was obtained. The polishing layer and a removable PET sheet were then laminated with an adhesive layer (50 μm in thickness) interposed therebetween. The adhesive layer was made of a polyester-based hot-melt adhesive containing 100 parts by weight of crystalline polyester resin (VYLON GM420 manufactured by TOYOBO CO., LTD.) and 5 parts by weight of o-cresol novolac epoxy resin (EOCN 4400 manufactured by Nippon Kayaku Co., Ltd.) having two or more glycidyl groups per molecule. The adhesive layer was then heated at 100° C. with an infrared heater so that the polishing layer and the adhesive layer were temporarily bonded together. The removable PET sheet was then removed. The polyester-based hot-melt adhesive used had a melting point of 142° C., a specific gravity of 1.22, and a melt flow index of 21 g/10 min.

Subsequently, a removable protective member (fluororesin sheet, 55 mm×18 mm, 100 μm in thickness) was bonded to a part of the adhesive layer corresponding to the light transmitting region. The adhesive layer was then heated at 150° C. with an infrared heater so that the polyester-based hot-melt adhesive was melted. Using a laminator, a urethane foam support layer (NIPPALAY EXT manufactured by NHK SPRING Co., Ltd.) was laminated onto the melted adhesive, and the polishing layer, the melted adhesive, and the support layer were pressure-bonded together. Subsequently, the melted adhesive was cured, so that the polishing layer and the support layer were bonded together with the adhesive layer interposed therebetween and the light transmitting region was bonded and completely fixed to the adhesive layer. The support layer was then cut in a size corresponding to that of the polishing layer.

Using a laminator, a double-sided pressure-sensitive adhesive tape (442JA manufactured by 3M Company) was bonded to the support layer. Parts of the support layer and the double-sided pressure-sensitive adhesive tape corresponding to the light transmitting region were removed by cutting, and the removable protective member was also removed, so that an opening B was formed and a laminated polishing pad was obtained.

Example 2

Preparation of Laminated Polishing Pad

Figure 3:
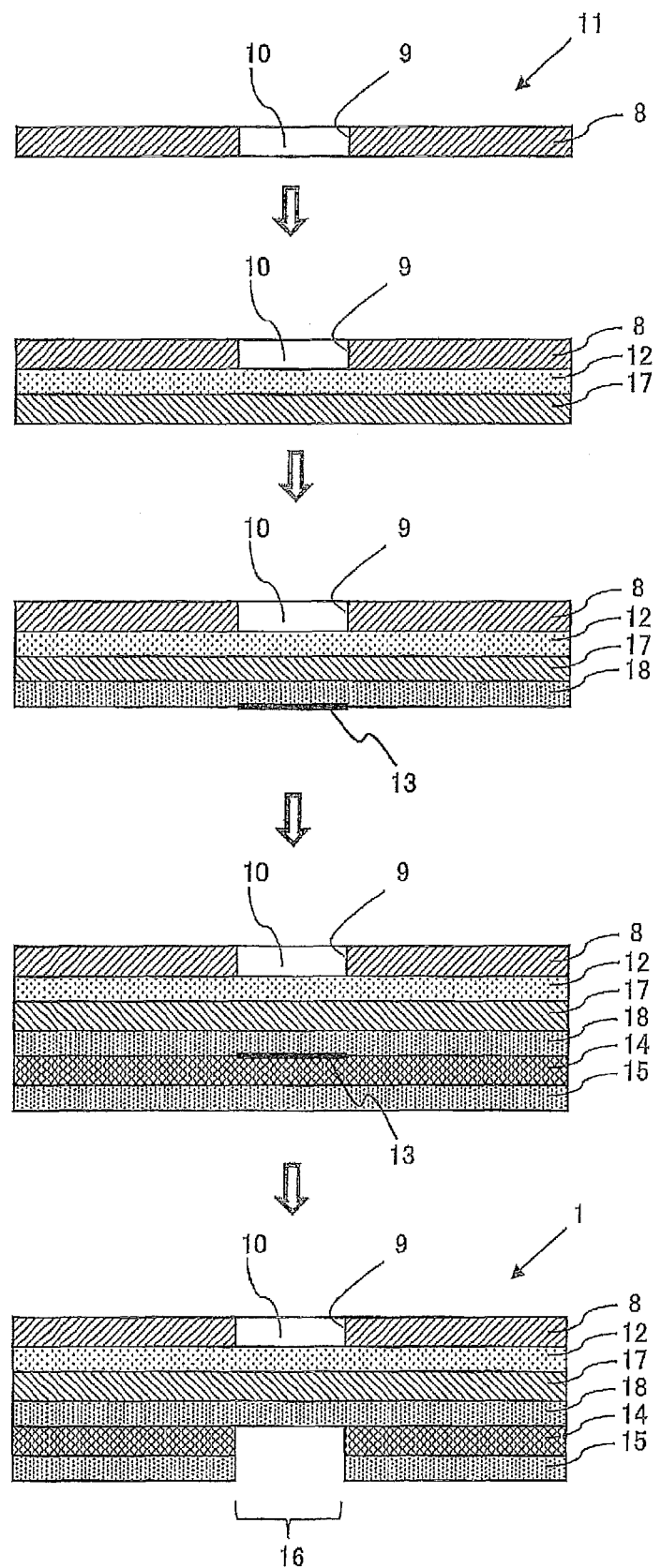
FIG. 3 is a schematic process drawing showing another example of the method of the invention for manufacturing a laminated polishing pad.

A laminated polishing pad was prepared by the method shown in FIG. 3. First, a polishing layer was prepared by the same process as in Example 1. An adhesive layer (50 μm in thickness) was then placed on an intermediate layer made of a PET sheet. The adhesive layer was made of a polyester-based hot-melt adhesive containing 100 parts by weight of crystalline polyester resin (VYLON GM420 manufactured by TOYOBO CO., LTD.) and 5 parts by weight of o-cresol novolac epoxy resin (EOCN 4400 manufactured by Nippon Kayaku Co., Ltd.) having two or more glycidyl groups per molecule. The adhesive layer was then melted by heating at 150° C. with an infrared heater. Using a laminator, the polishing layer was then laminated and pressure-bonded onto the melted adhesive. Subsequently, the melted adhesive was cured, so that the polishing layer and the intermediate layer were bonded together with the adhesive layer interposed therebetween, and the light transmitting region was bonded and completely fixed to the adhesive layer. The intermediate layer was then cut in a size corresponding to that of the polishing layer.

Using a laminator, a double-sided pressure-sensitive adhesive tape (442JA manufactured by 3M Company) was bonded to the intermediate layer. A removable protective member (fluororesin sheet, 55 mm×18 mm, 100 μm in thickness) was bonded to a part of the double-sided pressure-sensitive adhesive tape corresponding to the light transmitting region.

Using a laminator, a urethane foam support layer (NIPPALAY EXT manufactured by NHK SPRING Co., Ltd.) was then bonded to the double-sided pressure-sensitive adhesive tape. Subsequently, another double-sided pressure-sensitive adhesive tape (442JA manufactured by 3M Company) was bonded to the support layer.

Parts of the support layer and the double-sided pressure-sensitive adhesive tape corresponding to the light transmitting region were removed by cutting, and the removable protective member was also removed, so that an opening B was formed and a laminated polishing pad was obtained.

Comparative Example 1

Preparation of Laminated Polishing Pad

First, a light transmitting region was inserted into the opening A of a polishing region and temporarily fixed, so that a polishing layer was obtained. A double-sided pressure-sensitive adhesive tape (Double Tack Tape manufactured by SEKISUI CHEMICAL CO., LTD.) was then bonded to the polishing layer. Subsequently, a removable protective member (fluororesin sheet, 55 mm×18 mm, 100 μm in thickness) was bonded to a part of the double-sided pressure-sensitive adhesive tape corresponding to the light transmitting region. Using a laminator, a urethane foam support layer (NIPPALAY EXT manufactured by NHK SPRING Co., Ltd.) was further bonded to the double-sided pressure-sensitive adhesive tape. The support layer was then cut in a size corresponding to that of the polishing layer.

Using a laminator, a double-sided pressure-sensitive adhesive tape (442JA manufactured by 3M Company) was then bonded to the support layer. Parts of the support layer and the double-sided pressure-sensitive adhesive tape (442JA) corresponding to the light transmitting region were removed by cutting, and the removable protective member was also removed, so that an opening B was formed and a laminated polishing pad was obtained.

TABLE 1

| | Example 1 | Example 2 | Comparative Example 1 |
|---|---|---|---|
| State of adhesion between layers of laminated polishing pad after 60 hour polishing | No lifting | No lifting | Lifting |
| State of back side of light transmitting region after 60 hour polishing | No clouding | No clouding | Clouding caused by waterdrops |
| Shearing stress (N/25 mm square) Initial | 1090 Material failure | 1160 Material failure | 650 Interfacial peeling |
| After 60 hours | 1020 Material failure | 1080 Material failure | 370 Interfacial peeling |

INDUSTRIAL APPLICABILITY

A laminated polishing pad of the invention is capable of performing planarization materials requiring a high surface planarity such as optical materials including a lens and a reflective mirror, a silicon wafer, a glass substrate or an aluminum substrate for a hard disk and a product of general metal polishing with stability and a high polishing efficiency. A laminated polishing pad of the invention is preferably employed, especially, in a planarization step of a silicon wafer or a device on which an oxide layer or a metal layer has been formed prior to further stacking an oxide layer or a metal layer thereon.

DESCRIPTION OF REFERENCE SIGNS

In the drawings, reference numeral 1 represents a laminated polishing pad, 2 a polishing platen, 3 a polishing agent (slurry), 4 an object to be polished (semiconductor wafer), 5 a support (polishing head), 6 and 7 each a rotating shaft, 8 a polishing region, 9 an opening A, 10 a light transmitting region, 11 a polishing layer, 12 an adhesive member X, 13 a removable protective member, 14 a support layer, 15 a pressure-sensitive adhesive member, 16 an opening B, 17 an intermediate layer, 18 an adhesive member Y.

The invention claimed is:

1. A method for manufacturing a laminated polishing pad, comprising the steps of: forming a polishing layer by providing a light transmitting region in an opening A of a polishing region; providing an adhesive member X on one side of the polishing layer, wherein the adhesive member X contains a hot-melt adhesive; providing a removable protective member on a part of the adhesive member X corresponding to the light transmitting region; bonding a support layer to the adhesive member X on which the removable protective member is provided; and removing a part of the support layer corresponding to the light transmitting region and also removing the removable protective member to form an opening B.

2. A method for manufacturing a laminated polishing pad, comprising the steps of: forming a polishing layer by providing a light transmitting region in an opening A of a polishing region; bonding the polishing layer and an intermediate layer together with an adhesive member X containing a hot-melt adhesive; providing an adhesive member Y on the intermediate layer; providing a removable protective member on a part of the adhesive member Y corresponding to the light transmitting region; bonding a support layer to the adhesive member Y on which the removable protective member is provided; and removing a part of the support layer corresponding to the light transmitting region and also removing the removable protective member to form an opening B.

3. A method for manufacturing a laminated polishing pad, comprising the steps of: forming a polishing layer by providing a light transmitting region in an opening A of a polishing region; bonding the polishing layer and an intermediate layer together with an adhesive member X containing a hot-melt adhesive; providing a removable protective member on a part of the intermediate layer corresponding to the light transmitting region; providing an adhesive member Y on the intermediate layer on which the removable protective member is provided; bonding a support layer to the adhesive member Y; and removing parts of the adhesive member Y and the support layer corresponding to the light transmitting region and also removing the removable protective member to form an opening B.

4. The method according to claim 2, wherein the intermediate layer is a resin film.

5. The method according to claim 1, wherein the adhesive member X is an adhesive layer containing a polyester-based hot-melt adhesive or a double-sided adhesive tape comprising a substrate and adhesive layers provided on both sides of the substrate, wherein the adhesive layers contain a polyester-based hot-melt adhesive, and the polyester-based hot-melt adhesive contains 100 parts by weight of a polyester resin as a base polymer and 2 to 10 parts by weight of an epoxy resin having two or more glycidyl groups per molecule.

6. The method according to claim 5, wherein the polyester resin is a crystalline polyester resin.

7. A laminated polishing pad obtained by the method according to claim 1.

8. A method for producing a semiconductor device, comprising the step of polishing a surface of a semiconductor wafer with the laminated polishing pad according to claim 7.

9. The method according to claim 3, wherein the intermediate layer is a resin film.

10. The method according to claim 2, wherein the adhesive member X is an adhesive layer containing a polyester-based hot-melt adhesive or a double-sided adhesive tape comprising a substrate and adhesive layers provided on both sides of the substrate, wherein the adhesive layers contain a polyester-based hot-melt adhesive, and the polyester-based hot-melt adhesive contains 100 parts by weight of a polyester resin as a base polymer and 2 to 10 parts by weight of an epoxy resin having two or more glycidyl groups per molecule.

11. The method according to claim 3, wherein the adhesive member X is an adhesive layer containing a polyester-based hot-melt adhesive or a double-sided adhesive tape comprising a substrate and adhesive layers provided on both sides of the substrate, wherein the adhesive layers contain a polyester-based hot-melt adhesive, and the polyester-based hot-melt adhesive contains 100 parts by weight of a polyester resin as a base polymer and 2 to 10 parts by weight of an epoxy resin having two or more glycidyl groups per molecule.

12. The method according to claim 10, wherein the polyester resin is a crystalline polyester resin.

13. The method according to claim 11, wherein the polyester resin is a crystalline polyester resin.

14. A laminated polishing pad obtained by the method according to claim 2.

15. A laminated polishing pad obtained by the method according to claim 3.

16. A method for producing a semiconductor device, comprising the step of polishing a surface of a semiconductor wafer with the laminated polishing pad according to claim 14.

17. A method for producing a semiconductor device, comprising the step of polishing a surface of a semiconductor wafer with the laminated polishing pad according to claim 15.

* * * * *